(12) United States Patent
Chen et al.

(10) Patent No.: US 6,703,266 B1
(45) Date of Patent: Mar. 9, 2004

(54) METHOD FOR FABRICATING THIN FILM TRANSISTOR ARRAY AND DRIVING CIRCUIT

(75) Inventors: Hsin-Ming Chen, Hsinchu (TW); Yaw-Ming Tsai, Taichung (TW); Chu-Jung Shih, Taipei (TW)

(73) Assignee: Toppoly Optoelectronics Corp., Miao-Li County (TW)

( * ) Notice: Subject to any disclaimer, the term of this patent is extended or adjusted under 35 U.S.C. 154(b) by 0 days.

(21) Appl. No.: 10/249,562

(22) Filed: Apr. 18, 2003

(30) Foreign Application Priority Data

Nov. 22, 2002 (TW) ........................ 91134043 A

(51) Int. Cl.⁷ ................... H01L 21/00; H01L 21/44; H01L 21/82; H01L 21/331; H01L 21/425
(52) U.S. Cl. ................ 438/151; 438/110; 438/128; 438/164; 438/365; 438/531; 438/551; 438/552; 438/585; 438/586; 438/587; 438/671; 438/706; 438/707; 438/717; 438/733; 438/738; 438/942
(58) Field of Search ................ 438/110, 128, 438/151, 164, 365, 531, 551, 552, 585, 586, 587, 671, 706, 707, 717, 733, 738

(56) References Cited

U.S. PATENT DOCUMENTS

| | | | | |
|---|---|---|---|---|
| 5,474,945 A | * | 12/1995 | Yamazaki et al. | 438/151 |
| 5,814,530 A | * | 9/1998 | Tsai et al. | 438/30 |
| 5,959,312 A | * | 9/1999 | Tsai et al. | 257/57 |
| 6,300,174 B1 | * | 10/2001 | Bae | 438/151 |
| 6,534,350 B2 | * | 3/2003 | Chen et al. | 438/163 |
| 6,617,203 B2 | * | 9/2003 | Kim et al. | 438/149 |
| 2002/0068390 A1 | * | 6/2002 | Gosain et al. | 438/149 |

* cited by examiner

*Primary Examiner*—John Niebling
*Assistant Examiner*—Stanetta Isaac
(74) *Attorney, Agent, or Firm*—Jiang Chyun IP Office

(57) ABSTRACT

A method for fabricating a thin film transistor array and driving circuit comprising the steps of: providing a substrate; patterning a polysilicon layer and an N+ thin film over the substrate to form a plurality of islands; patterning the islands to form P+ doped regions; patterning out source/drain terminals and the lower electrode of a storage capacitor; etching back the N+ thin film; patterning out a gate and the upper electrode of the storage capacitor and patterning a passivation layer and a conductive layer to form pixel electrodes and a wiring layout.

21 Claims, 12 Drawing Sheets

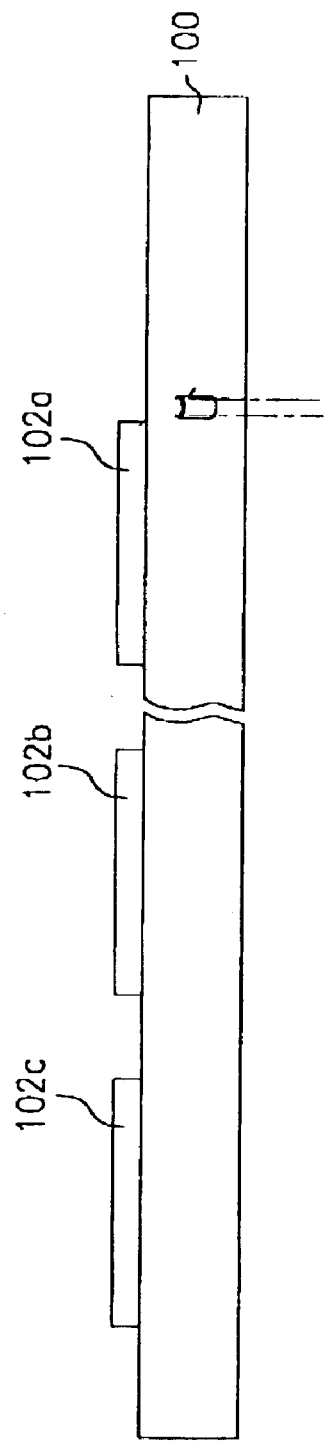
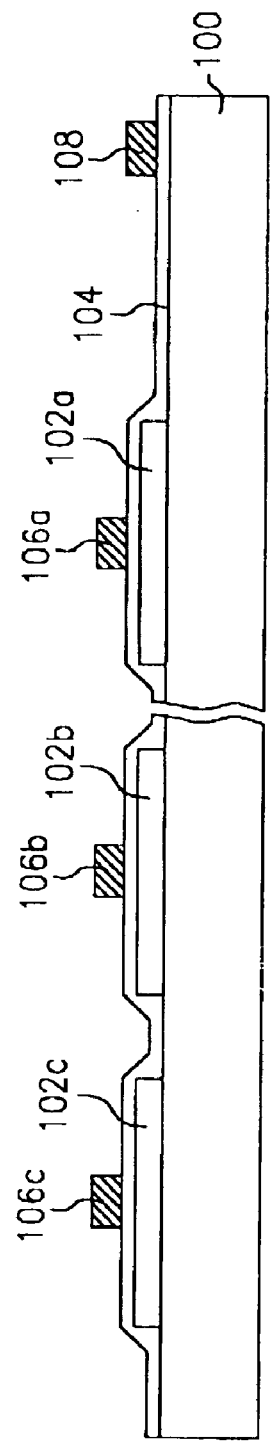

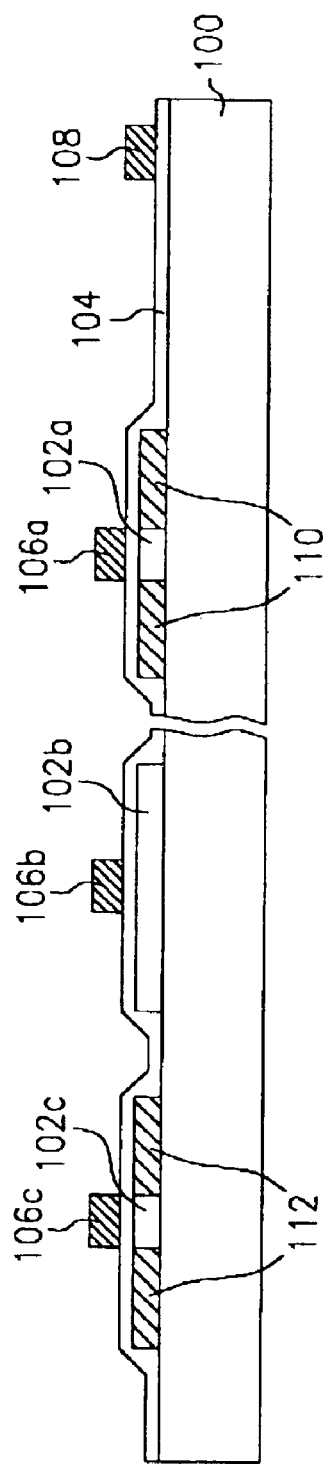
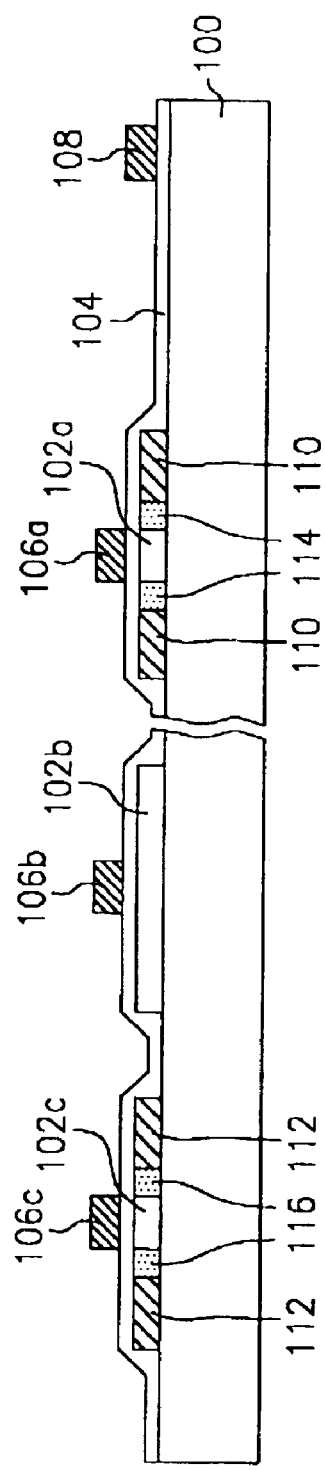

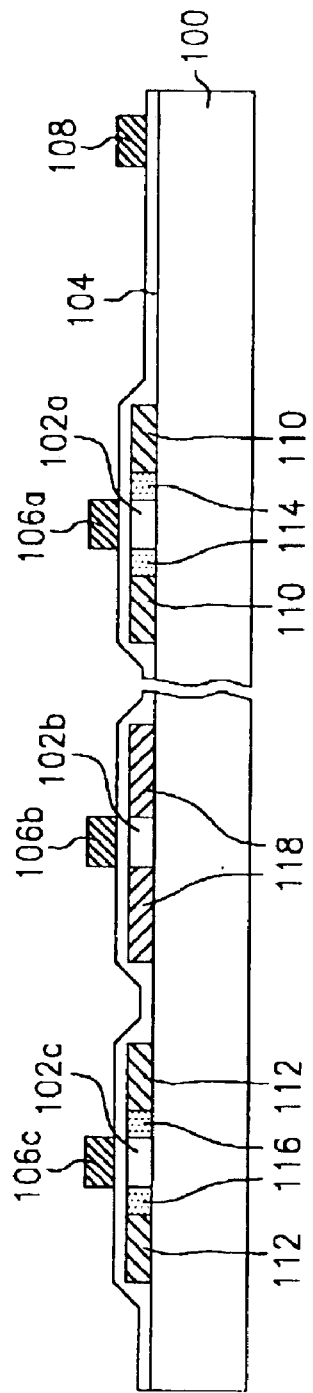
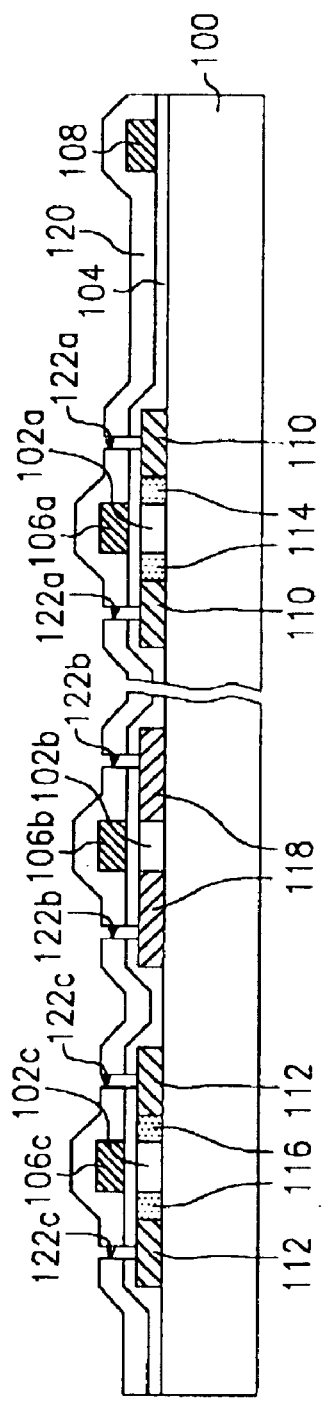
FIG. 1E (PRIOR ART)
FIG. 1F (PRIOR ART)

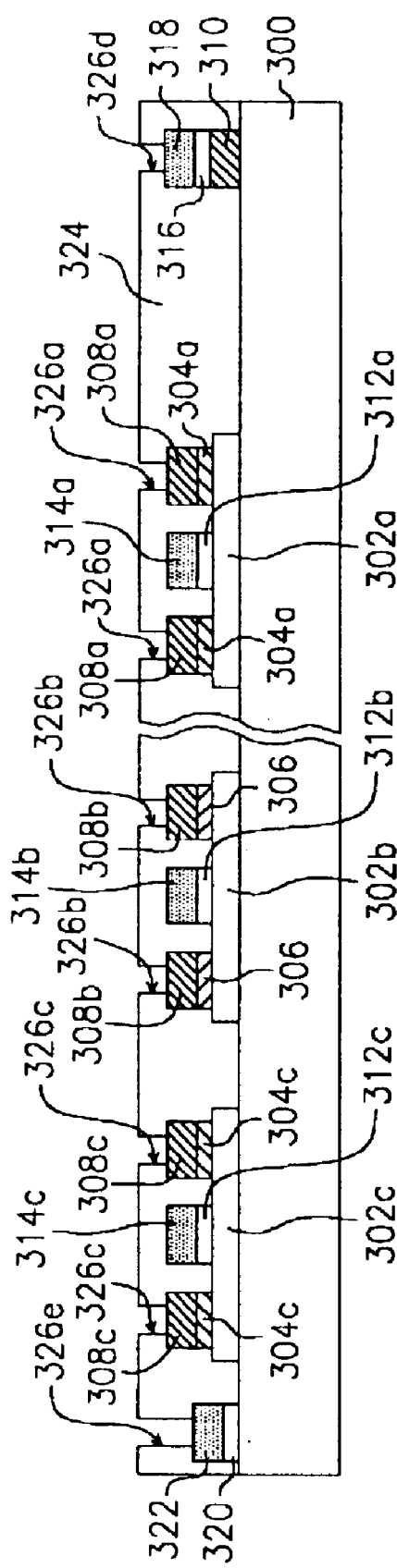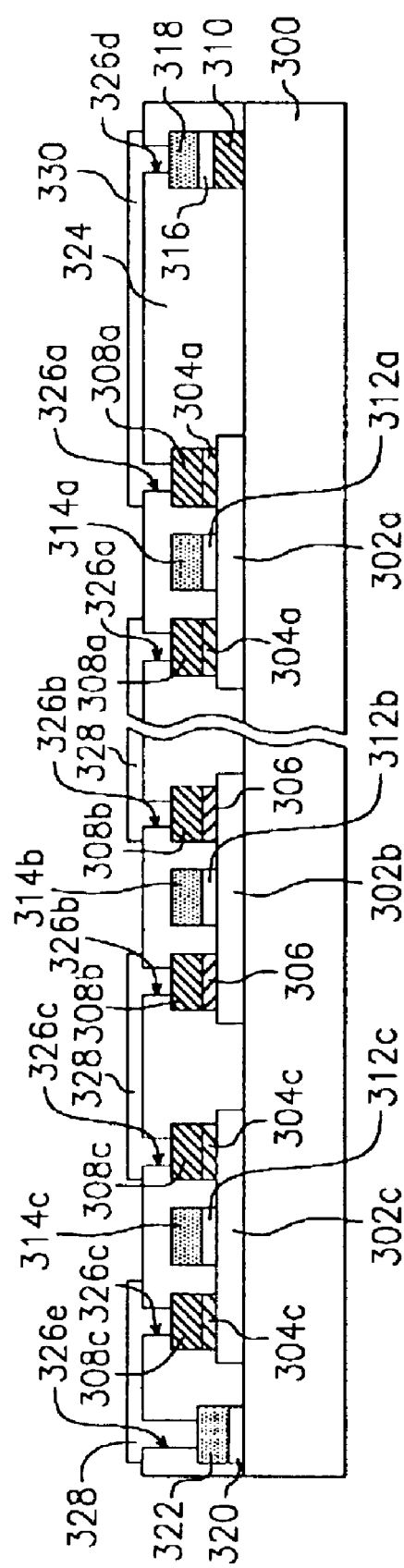
FIG. 3F
FIG. 3G

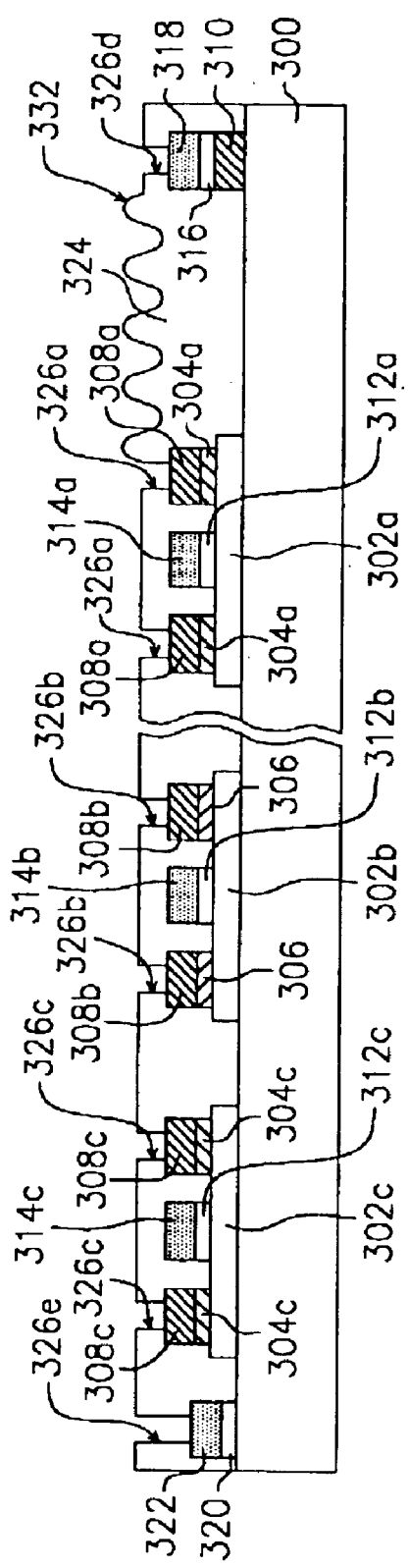
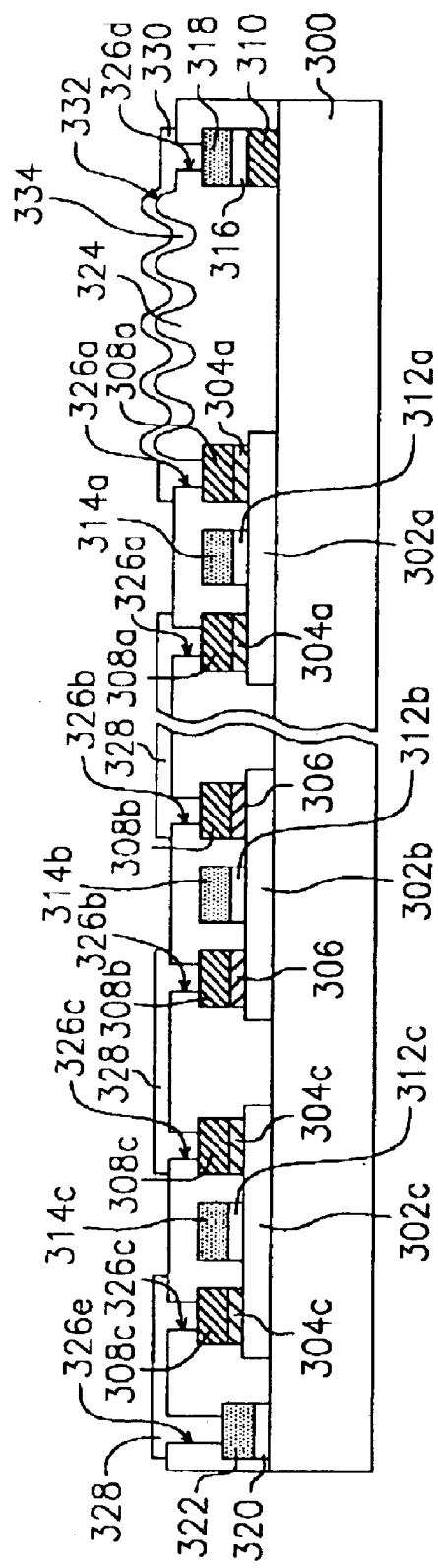
FIG. 3H
FIG. 3I

US 6,703,266 B1

METHOD FOR FABRICATING THIN FILM TRANSISTOR ARRAY AND DRIVING CIRCUIT

CROSS REFERENCE TO RELATED APPLICATIONS

This application claims the priority benefit of Taiwan application serial no. 91134043, filed on Nov. 22, 2002.

BACKGROUND OF INVENTION

1. Field of Invention

The present invention relates to a method for fabricating thin film transistor array and driving circuit. More particularly, the present invention relates to a method of fabricating thin film transistor array and driving circuit that uses just six masking operations.

2. Description of Related Art

In recent years, the rapid advance in the fabrication of semiconductor devices and display devices has lead to the popularization of multimedia systems. Due to the production of high-quality and low-cost displays such as cathode ray tubes, these displays now represent a large chunk in the display market. However, from the standpoint of a desktop display user or an environmentalist, a cathode ray tube is bulky, consumes a lot of energy and is also a source of radiation. Since a lot of material is required to fabricate each cathode ray tube and a lot of energy is wasted in its operation, other types of displays including thin film transistor liquid crystal display (TFT-LCD) are developed as a substitute. A conventional TFT-LCD is a slim and compact display capable of producing high-quality images. Each TFT-LCD uses very little energy and is virtually radiation-free. All these advantages have championed the TFT-LCD in the mainstream display market.

In general, a thin film transistor may be classified as an amorphous thin film transistor or a polysilicon thin film transistor. A polysilicon thin film transistor fabricated using a low-temperature polysilicon (LTPS) technique is different from an amorphous thin film transistor using an amorphous silicon (a-Si) technique. The LTPS transistor has an electron mobility greater than 200 $cm^2$/V-sec and hence the thin film transistor can have a smaller dimension, a larger aperture ratio and a lower power rating. In addition, the LTPS process also permits the concurrent fabrication of a portion of the driving circuit and the thin film transistor in the same substrate so that the subsequently formed liquid crystal display panel has a greater reliability and a lower average production cost.

FIGS. 1A to 1H are schematic cross-sectional views showing the progression of steps for fabricating a conventional thin film transistor array and driving circuit. As shown in FIG. 1A, a substrate 100 is provided. A polysilicon layer is formed over the substrate 100. Thereafter, the polysilicon layer is patterned using a first masking process (Mask 1) so that a plurality of poly-islands 102a, 102b and 102c are formed over the substrate 100. The poly-island 102a is a location for forming a thin film transistor while the poly-islands 102b and 102c are locations for forming a driving circuit such as a complementary metal-oxide-semiconductor (CMOS) circuit. Since the poly-island 102a is eventually transformed into a thin film transistor, poly-islands 102a are normally positioned on top of the substrate 100 as an array. Similarly, since the poly-islands 102b and 102c are eventually transformed into driving circuits, the poly-islands 102b and 102c are normally positioned close to the peripheral region of the substrate 100.

As shown in FIG. 1B, a first dielectric layer 104 and a conductive layer (not shown) are sequentially formed over the substrate 100 with the poly-islands 102a, 102b and 102c thereon. The conductive layer is patterned using a second masking process (Mask 2) to form gates 106a, 106b and 106c over the poly-islands 102a, 102b and 102c respectively and the lower electrode 108 of a storage capacity on a suitable location on the substrate 100.

As shown in FIG. 1C, N+ doped regions 110 and N+ doped regions 112 are patterned out inside the island 102a and the island 102c using a third masking process (Mask 3). The N+ doped regions 110 inside the island 102a is located on each side of the gate 106a and the N+ doped regions 112 inside the island 102c are located on each side of the gate 106c.

As shown in FIG. 1D, N− doped regions 114 are patterned inside the island 102a and N− doped regions 116 are patterned inside the island 102c using a fourth masking process (Mask 4). Each N− doped region 114 inside the island 102a is located between the gate 106a and one N+ doped regions 110. Similarly, each N− doped region 116 inside the island 102c is located between the gate 106c and one N+ doped region 112.

As shown in FIG. 1E, P+ doped regions 118 are patterned inside the island 102b using a fifth masking process (Mask 5). The P+ doped regions 118 inside the island 102b are located on each side of the gate 106b.

As shown in FIG. 1F, a second dielectric layer 120 is formed over the substrate 100. Thereafter, the first dielectric layer 104 and the second dielectric layer 120 are patterned using a sixth masking process (Mask 6) to form openings 122a, 122b and 122c. The opening 122a exposes the N+ doped region 110, the opening 122b exposes the P+ doped region 118 and the opening 122c exposes the N+ doped region 112.

As shown in FIG. 1G, a conductive layer (not shown) is formed over the second dielectric layer 120. Thereafter, the conductive layer is patterned using a seventh masking process (Mask 7) to form source/drain terminals 124 (comprising 124a, 124b and 124c respectively). The source/drain terminals 124 are electrically connected to the N+ doped region 110, the P+ doped region 118 and the N+ doped region 112 through the opening 122a, the opening 122b and the opening 122c respectively.

As shown in FIG. 1H, a planarization layer 126 is formed over the substrate 100 with the source/drain terminals 124 thereon. Thereafter, the planarization layer 126 is patterned using an eighth masking process (Mask 8) to form an opening 128 for exposing the source/drain terminal 124a. After patterning the planarization layer 126, a conductive layer (not shown) is formed over the substrate 100. The conductive layer is a transparent layer typically made from indium-tin-oxide material. The conductive layer is patterned using a ninth masking process (Mask 9) to form a pixel electrode 130.

As shown on the left side of FIG. 1H, the N− doped region 116 and the N+ doped region 112 inside the island 102c, the gate 106c and the source/drain terminal 124c together constitute an N− type metal-oxide-semiconductor (NMOS) transistor. The P+ doped region 118 inside the island 102b, the gate 106b and the source/drain terminal 124b together constitute a P-type metal-oxide-semiconductor (PMOS) transistor. The NMOS transistor and the PMOS transistor together constitute a complementary metal-oxidesemiconductor (CMOS) transistor. The CMOS transistor on the substrate 100 is a driving circuit for driving the thin film transistor on the right side of FIG. 1H and hence controlling pixel display.

As shown on the right side of FIG. 1H, the N− doped region 110 and the N+ doped region 114 inside the island 102a, the gate 106a and the source/drain terminal 124a together constitute a polysilicon thin film transistor (poly-TFT). The writing of data into the pixel electrode 120 of the thin film transistor is driven and controlled by the CMOS.

FIG. 2 is a flow chart showing the steps for fabricating a conventional thin film transistor array and driving circuit. As shown in FIG. 2, the process of fabricating the thin film transistor array and the driving circuit includes: patterning a polysilicon layer (S200); patterning out a gate and the lower electrode of a storage capacitor (S202); patterning out a N+ doped region (S204), patterning out an N− doped region (S206); patterning out a P+ doped region (S208), patterning out a first dielectric layer (S210); patterning out source/drain terminals and the upper electrode of the storage capacitor (S212); patterning a second dielectric layer (S214) and patterning out a pixel electrode (S216).

The aforementioned method of fabricating a conventional thin film transistor array and driving circuits involves a number of masking processes such as eight (not including the fabrication of the N− doped regions 114 and 116) or nine. Since the number of masking steps required for fabricating the thin film transistor and driving circuit is high, time for producing the display panel is long and the yield is low. Hence, production cost using the conventional method is relatively high.

SUMMARY OF INVENTION

Accordingly, one object of the present invention is to provide a method for fabricating a thin film transistor array and driving circuit through six masking steps.

To achieve these and other advantages and in accordance with the purpose of the invention, as embodied and broadly described herein, the invention provides a method for fabricating a thin film transistor array and driving circuit. The method comprises the steps of: providing a substrate; patterning a polysilicon layer and an N+ thin film over the substrate to form a plurality of islands; patterning the islands to form P+ doped regions; patterning out source/drain terminals and the lower electrode of a storage capacitor; etching back the N+ thin film; patterning out a gate and the upper electrode of the storage capacitor and patterning a passivation layer and a conductive layer to form pixel electrodes and a wiring layout.

In this invention, after etching back the N+ thin film, an N− doped layer (lightly doped region-LDD) may form in the gap between the gate and the source/drain terminal to improve the performance of the complementary metal-oxide-semiconductor (CMOS) driving circuit consisting of a PMOS transistor and an NMOS transistor.

In this invention, the polysilicon layer is formed, for example, by depositing amorphous silicon over the substrate and conducting an excimer laser annealing (ELA) operation on the amorphous silicon layer so that the amorphous silicon layer crystallizes into a polysilicon layer.

In this invention, the N+ doped thin film is formed, for example, by directly depositing N+ doped amorphous silicon in a chemical vapor deposition process. Alternatively, the N+ doped thin film is formed, for example, by depositing amorphous silicon and then conducting an N− type ion doping process.

In this invention, the gate, the source/drain terminals and the storage capacitor are formed, for example, by first depositing conductive material to form a first conductive layer. The first conductive layer is next patterned to form a source/drain terminal on each island and a plurality of lower electrodes on the substrate. Thereafter, a second metallic layer is formed and patterned to form a gate on each island and a plurality of upper electrode on the substrate. The lower electrodes and corresponding upper electrodes together form a plurality of storage capacitors.

In an alternative method of this invention, the gate, the source/drain terminals and the storage capacitor are formed, for example, by first depositing conductive material to form a first conductive layer. The first conductive layer is next patterned to form a gate on each island and a plurality of lower electrodes on the substrate. Thereafter, a second metallic layer is formed and patterned to form a source/drain terminal on each island and a plurality of upper electrode on the substrate. The lower electrodes and corresponding upper electrodes together form a plurality of storage capacitors.

In this invention, before the step of forming the gate further includes forming a gate insulation layer. After forming the gate insulation layer, the gate insulation layer is annealed by conducting a rapid thermal processing operation.

The aforementioned gate insulation layer may include at leas a first dielectric layer, for example. The first dielectric layer is fabricated using a material such as silicon oxide, silicon nitride or hydrogen-containing dielectric material. The gate insulation layer may also comprise at least of a first dielectric layer and a second dielectric layer. The first dielectric layer is fabricated using a material such as silicon oxide, silicon nitride or hydrogen-containing dielectric material and the second dielectric layer is fabricated using a material such as photosensitive resin.

In this invention, the gate is fabricated using material such as aluminum/molybdenum or aluminum/titanium alloy and the source/drain terminal is fabricated using material such as an aluminum/molybdenum alloy or molybdenum.

For a transparent type of panel, the conductive layer can be fabricated using transparent conductive material such as indium-tin oxide. For a reflective type of panel, the conductive layer can be fabricated using a metal with good reflective properties. In addition, the surface of the passivation layer underneath the conductive layer (usually a metal with good reflective properties) may be roughed to increase light reflectivity of the conductive layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1H are schematic cross-sectional views showing the progression of steps for fabricating a conventional thin film transistor array and driving circuit;

FIGS. 3A to 3I are schematic cross-sectional views showing the progression of steps for fabricating a thin film transistor array and driving circuit according to one preferred embodiment of this invention;

DETAILED DESCRIPTION

Figure 1G:
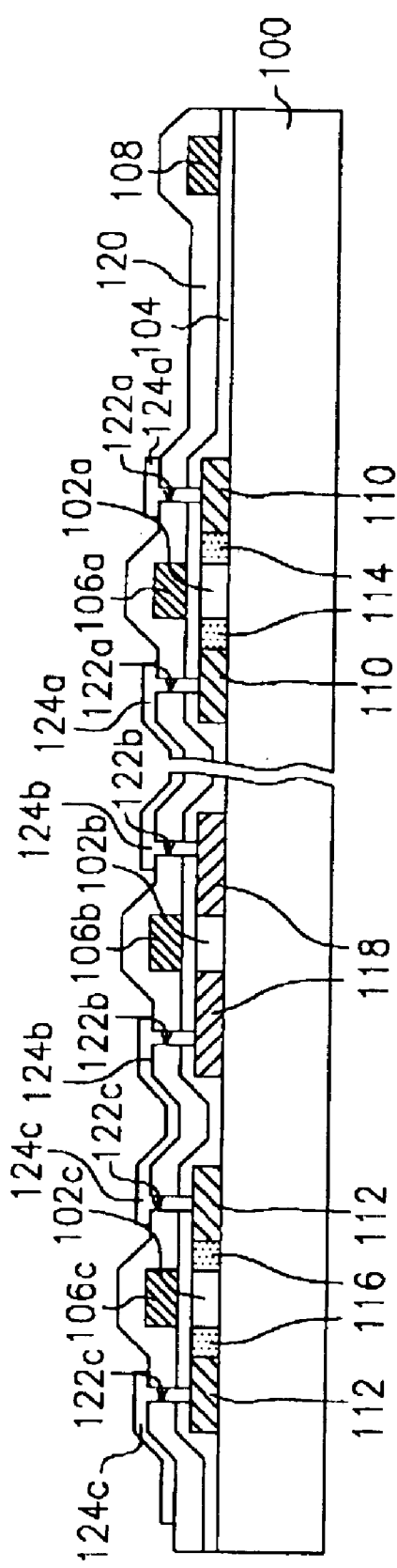
Figure 1H:
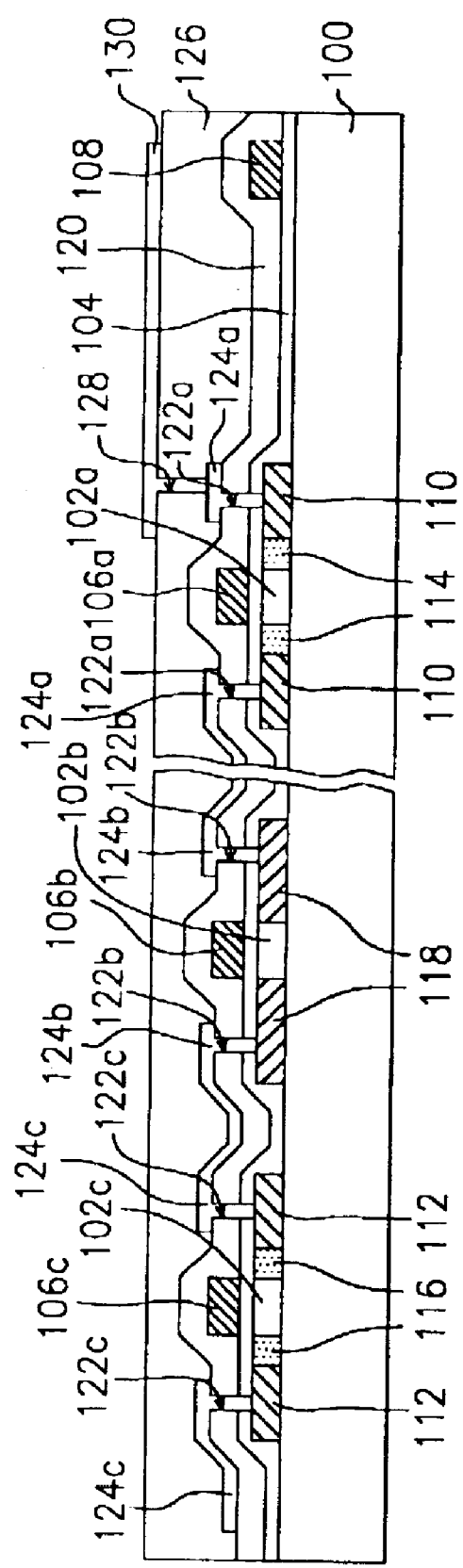
Figure 2:
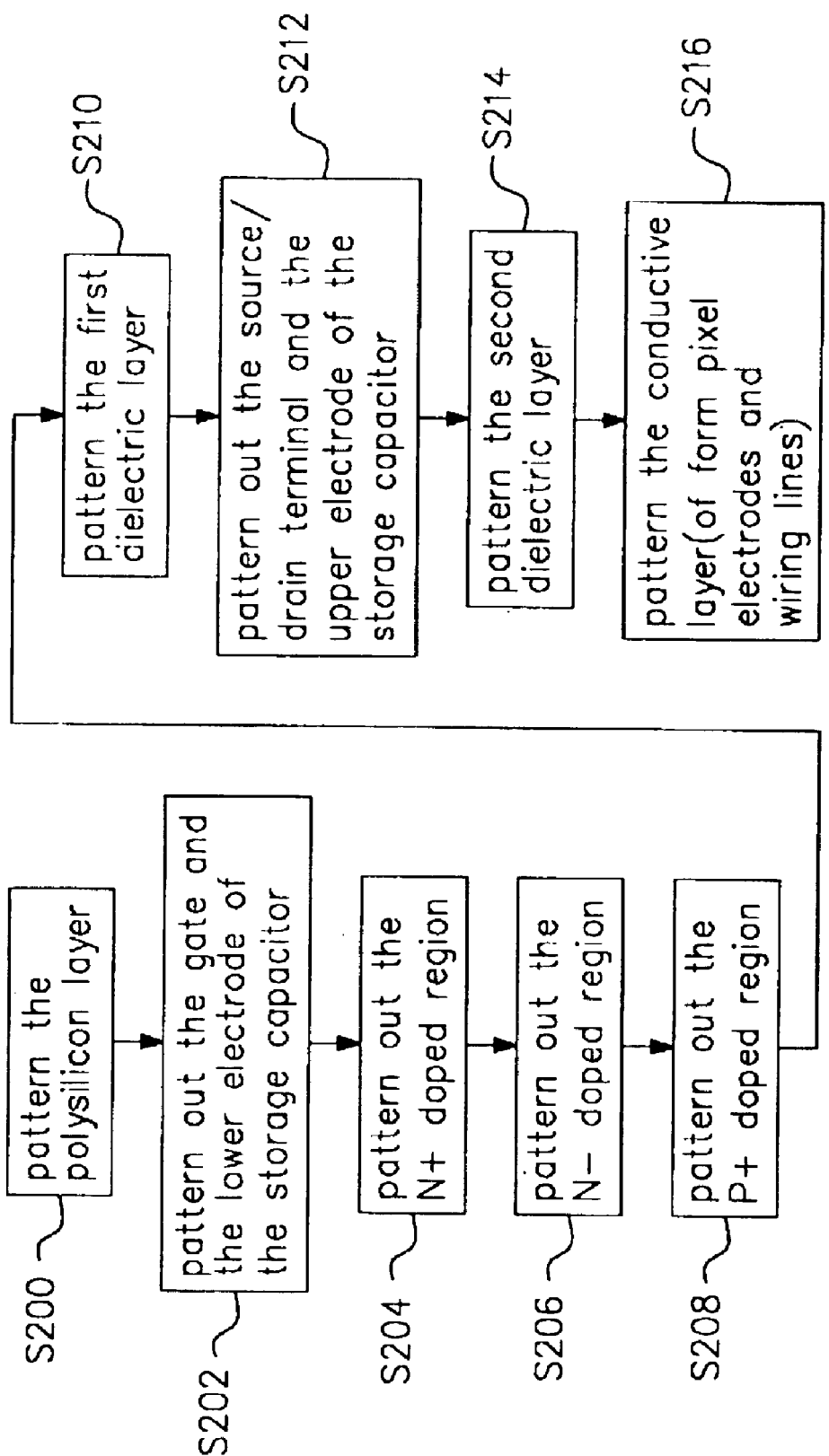
FIG. 2 is a flow chart showing the steps for fabricating a conventional thin film transistor array and driving circuit.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
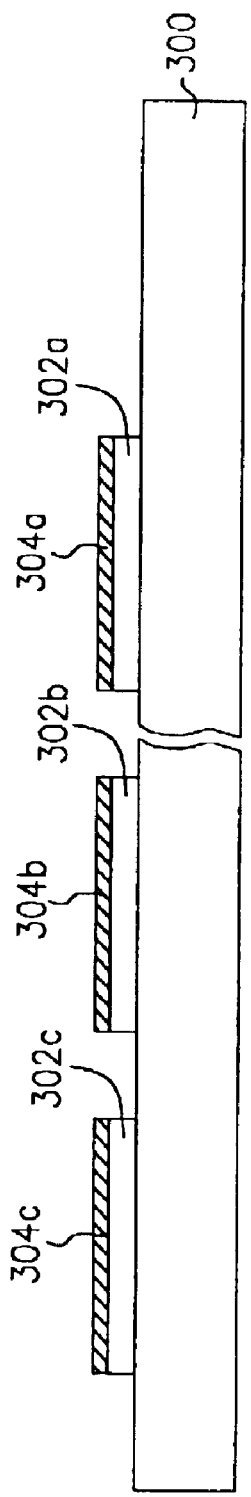

FIGS. 3A to 3I are schematic cross-sectional views showing the progression of steps for fabricating a thin film transistor array and driving circuit according to one preferred embodiment of this invention. As shown in FIG. 3A, a substrate 300 is provided. A polysilicon layer and an N+ doped thin film are sequentially formed over the substrate 200. Thereafter, the polysilicon layer and the N+ doped thin film are patterned in a first masking process (Mask 1) to form a plurality poly-islands comprising N+ doped thin films 304a, 304b, 304c stacked over polysilicon layers 302a, 302b, 302c respectively.

The polysilicon layer is formed, for example, by forming an amorphous thin film (a-Si) over the substrate 300 and then conducting an excimer laser annealing (ELA) operation on the amorphous layer so that the amorphous silicon crystallizes into a polysilicon layer. The N+ doped thin film is formed, for example, by depositing amorphous silicon with N+ dopants directly onto the substrate 300 in a chemical vapor deposition. Alternatively, an amorphous silicon thin film is formed over the substrate 300 followed by implanting N+ dopants into the amorphous silicon layer.

The island 302a is an area for forming a thin film transistor (TFT) and the islands 302b and 302c are areas for forming a driving circuit such as a CMOS circuit. Since the island 302a is the location for forming a thin film transistor, a plurality of islands like the island 302a is positioned as an array over the substrate 300. On the other hand, the islands 302b and 302c are mostly positioned on the peripheral or surrounding region of the substrate 300.

Figure 3B:
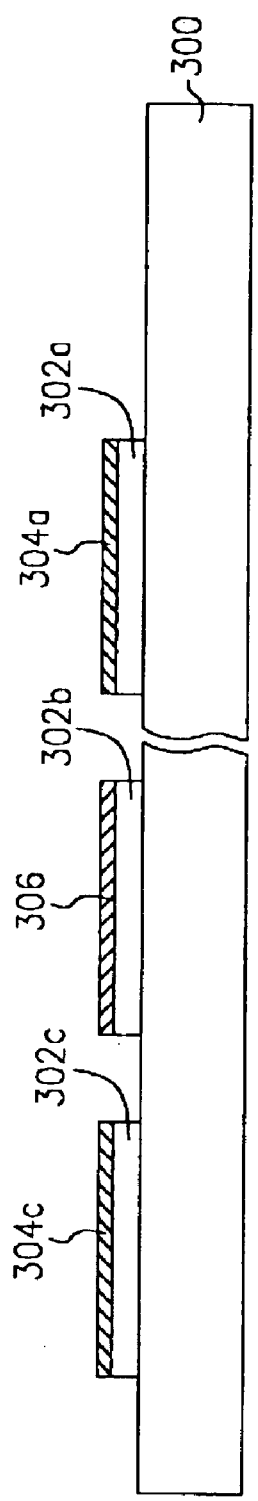
Figure 3C:
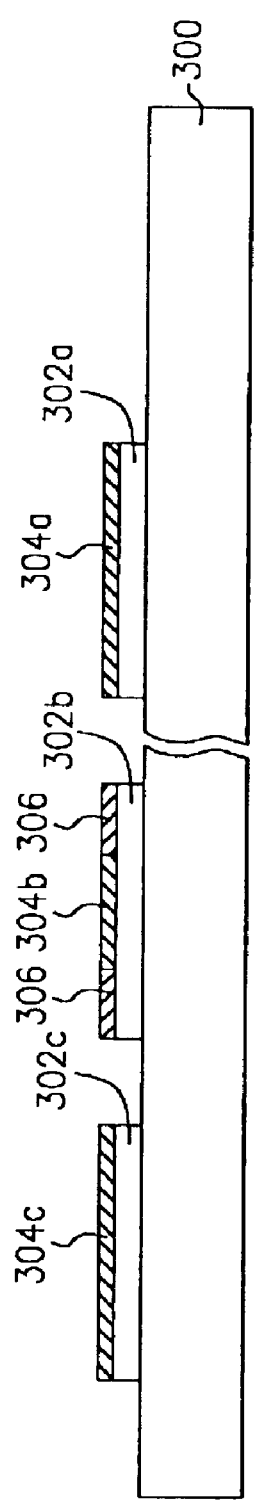

A P+ doped region 306 is formed inside the entire N+ dope thin film 304b (as shown in FIG. 3B) or inside a portion of the N+ doped thin film 304b (as shown in FIG. 3C) by implanting P-type ions in a second masking process (Mask 2).

Figure 3D:
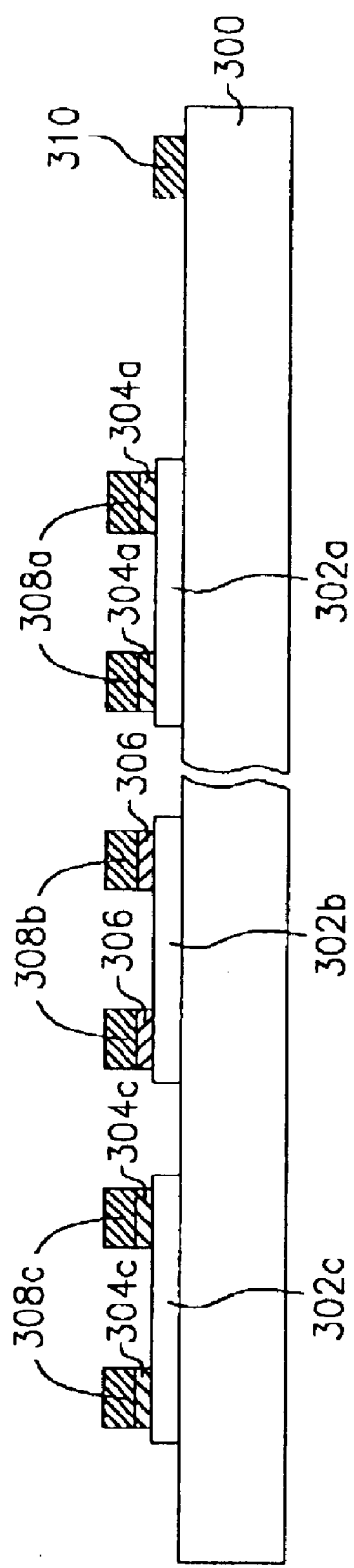

As shown in FIG. 3D, a first conductive layer (not shown) is formed over the substrate 300. The first conductive layer is patterned in a third masking process (Mask 3) to form source/drain terminals 308a, 308b, 308c over the N+ doped thin film 304a, the P+ doped region 306 and the N+ doped thin film 304c respectively and the lower electrode 310 of a storage capacitor on a suitable location on the substrate 300.

However, concurrent with the patterning of the first conductive layer, the third masking process may include the patterning of the N+ doped thin film 304a, 304b, 304c or the P+ doped region 306 (as shown in FIGS. 3B and 3C) underneath the first conductive layer. Thus, the source/drain terminals 308a and the N+ doped thin films 304a underneath have an identical pattern. Similarly, the source/drain terminals 308b and the P+ doped region 306 underneath have an identical pattern and the source/drain terminals 308c and the N+ doped thin film 304c underneath have an identical pattern.

Figure 3E:
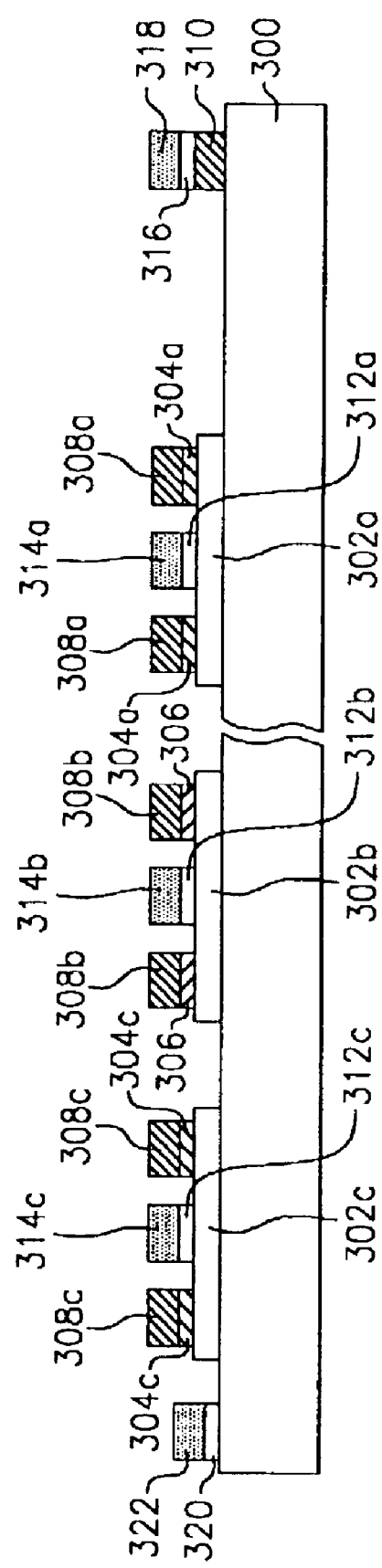

As shown in FIG. 3E, a first dielectric layer (not shown) and a second conductive layer (not shown) are sequentially formed over the substrate 300. Thereafter, the first dielectric layer and the second conductive layer are patterned in a fourth masking process (Mask 4) to form stack structures comprising of gates 314a, 314b, 314c over corresponding gate insulation layers 312a, 312b, 312c on the respective polysilicon layers 302a, 302b and 302c.

In this embodiment, a rapid thermal process (RTP) may be carried out after forming the gate insulation layers 312a, 312b and 312c to improve their material quality.

The gate insulation layers 312a, 312b and 312c comprise of at least one dielectric layer. The gate insulation layers are fabricated using a material such as silicon oxide, silicon nitride or hydrogen-containing dielectric material. However, the gate insulation layers 312a, 312b, 312c may comprise of at least a first dielectric layer and a second dielectric layer. The first dielectric layer is fabricated using a material such as silicon oxide, silicon nitride or hydrogen-containing dielectric material and the second dielectric layer is fabricated using a material such as a photosensitive resin. In addition, the gates 314a, 314b, 314c are fabricated using a material such as an aluminum/molybdenum alloy or an aluminum/titanium alloy and the source/drain terminals 308a, 308b, 308c are fabricated using a material such as an aluminum/molybdenum alloy or molybdenum.

The fourth masking process (Mask 4) also produces a dielectric layer 316 and an upper electrode 318 over the lower electrode 310. The lower electrode 310, the dielectric layer 316 and the upper electrode 318 together constitute a storage capacitor. In addition, the fourth masking process (Mask 4) also produces stack structures comprising of a wiring line 322 over a dielectric layer 320 in suitable locations over the substrate 300.

Furthermore, the fabricating sequence for forming the gates 314a, 314b, 314c and the source/drain terminals 308a, 308b, 308c may be adjusted according to demand. In other words, forming the gates 314a, 314b, 314c or the source/drain terminals 308a, 308b, 308c first matters very little.

As shown in FIG. 3F, a protection layer 324 is formed over the substrate 300. The protection layer 324 is patterned in a fifth masking process (Mask S). The protection layer 324 has a plurality of openings such as 326a, 326b, 326c, 326c, 326d and 326e. The opening 326a exposes the source/drain terminal 308a; the opening 326b exposes the source/drain terminal 308b; the opening 326c exposes the source/drain terminal 308c; the opening 326d exposes the upper electrode 318 of the storage capacitor and the opening 326d exposes the wiring line 322.

As shown in FIG. 3G, a conductive layer (not shown) is formed over the substrate 300. In general, the conductive layer is a transparent layer made from indium-tin oxide material. The conductive layer is patterned in a sixth masking process (Mask 6) to form a conductive wire 328 and a pixel electrode 330.

The structures shown in FIGS. 3H and 3I are very similar to the ones shown in FIGS. 3F and 3G. The major difference is that the structure in FIGS. 3H and 3I has a transparent panel while the structure in FIGS. 3F and 3G has a reflective panel. The protection layer 324 in FIGS. 3H and 3I has a roughened surface 332. In addition, the pixel electrode 334 over the roughened surface 332 is made using a highly conductive material. Through the roughened surface 332 of the protection layer 324, reflectivity of the pixel electrode (reflective electrode) 334 is boosted.

As shown on the left side of FIGS. 3G and 3I, the polysilicon layer 302c, the N+ doped thin film 304c, the source/drain terminal 308c, the gate insulation layer 312c and the gate 314c together constitute an N− type metal-oxide-semiconductor (NMOS) transistor. Similarly, the polysilicon layer 302b, the P+ doped thin film 306, the source/drain terminal 308b, the gate insulation layer 312b and the gate 314b together constitute a P-type metal-oxide-semiconductor (PMOS) transistor. The aforementioned NMOS transistor and PMOS transistor together form a complementary metal-oxide-semiconductor (CMOS) transistor. The CMOS transistor is a driving circuit for driving the thin film transistor shown on the right side of FIGS. 3G and 3I and hence controlling pixel display.

As shown on the right side of FIGS. 3G and 3I, the polysilicon layer 302a, the N+ doped thin film 304a, the source/drain terminal 308a, the gate insulation layer 312a and the gate 314a together form a polysilicon thin film transistor. Through the aforementioned CMOS driving circuit, the thin film transistor controls the writing of data to the pixel electrode 330 or the pixel electrode 334.

Figure 4:
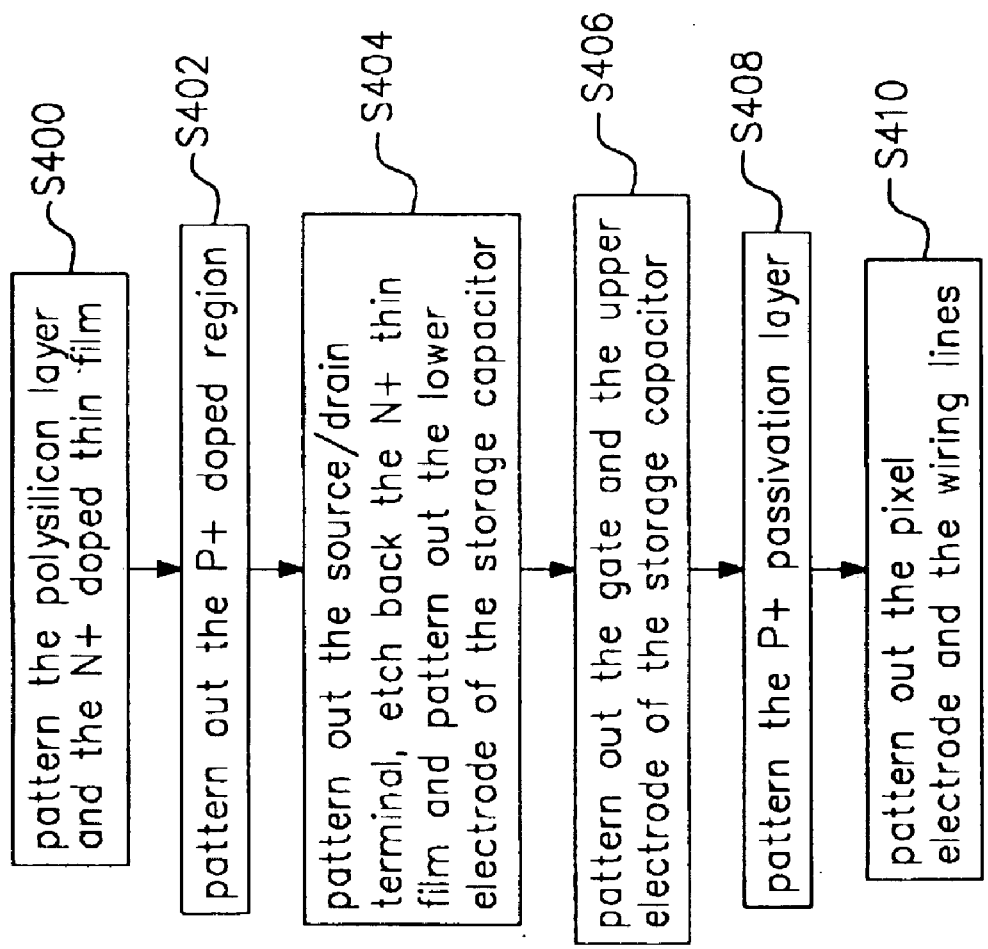
FIG. 4 is a flow chart showing the steps for fabricating a thin film transistor array and driving circuit according to one preferred embodiment of this invention.

FIG. 4 is a flow chart showing the steps for fabricating a thin film transistor array and driving circuit according to one preferred embodiment of this invention. The fabrication of the thin film transistor array and driving circuit comprises the steps of: patterning a polysilicon layer (S400); patterning out a P+ doped region (S402); patterning out source/drain terminals, etching back the N+ doped thin film and forming the lower electrode of a storage capacitor (S404); patterning out gates and the upper electrode of the storage capacitor (S406); patterning a passivation layer (S408) and patterning out pixel electrodes and wiring lines (S410). Altogether six masking processes are carried out from step S400 to S410 in the fabrication. However, if the NMOS transistor inside the driving circuit needs to have an N− doped region (lightly doped region), one more masking step is required.

Figure 5:
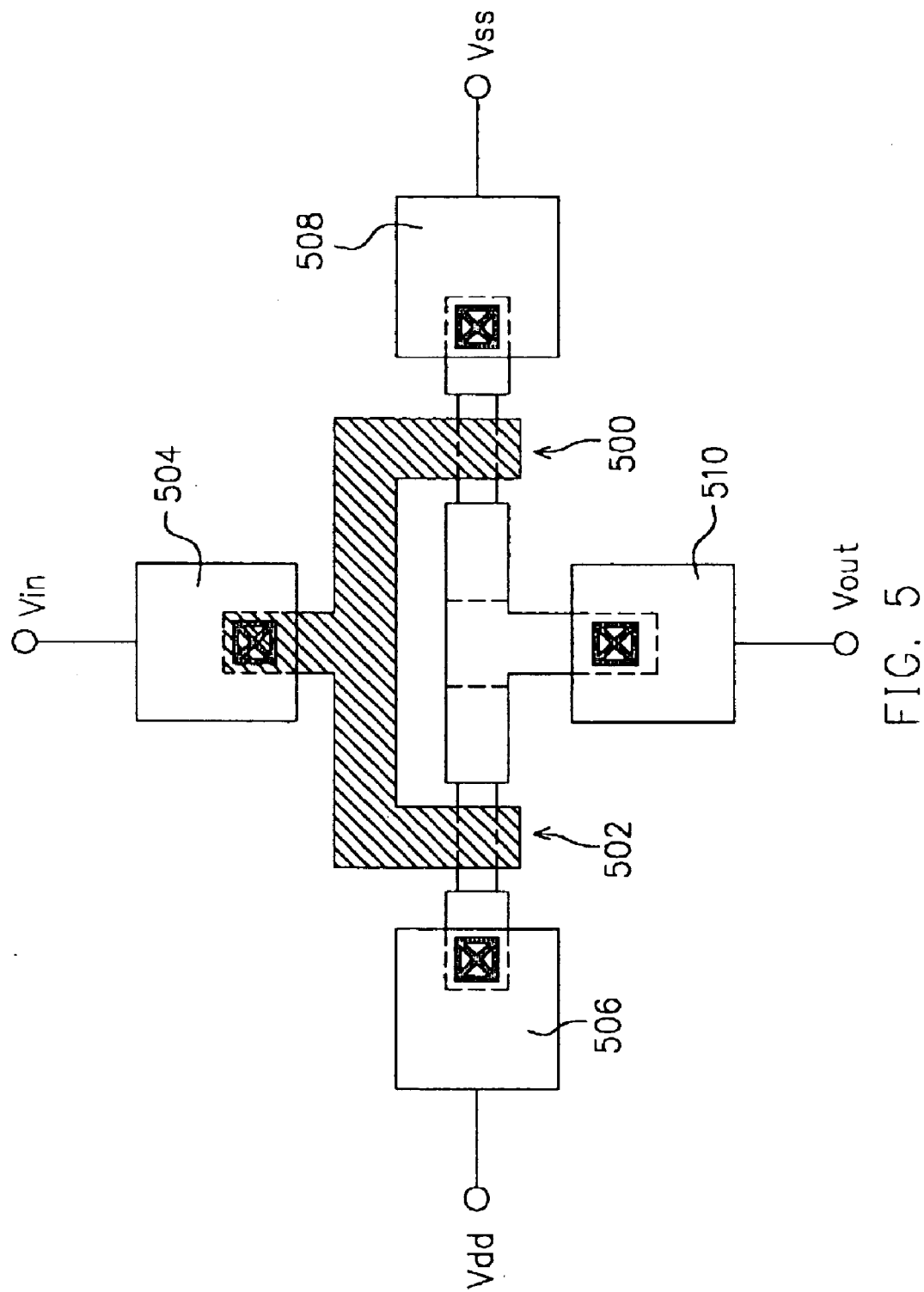
FIG. 5 is a top view showing the layout of a CMOS according to one preferred embodiment of this invention.

FIG. 5 is a top view showing the layout of a CMOS according to one preferred embodiment of this invention. As shown in FIG. 5, voltages $V_{in}$, $V_{dd}$ and $V_{ss}$ are applied to the respective contacts 504, 506 and 508. Since the contact 504 is electrically connected to the gates 500 and 502, the voltage $V_{in}$ applied to the contact 504 controls the channel conductance of both the NMOS transistor and the PMOS transistor. The channel conductance of the NMOS and PMOS (CMOS) transistor in turn affects the output voltage $V_{out}$ from the contact 510. Hence, the output voltage $V_{out}$ from the contact 510 can either be the voltage $V_{dd}$ or the voltage $V_{ss}$.

Yet, the driving circuit shown in FIG. 5 is only the layout of a CMOS unit. Anyone familiar with the technologies may combine the CMOS unit with other circuits or devices to drive the pixel array on a panel.

Figure 6:
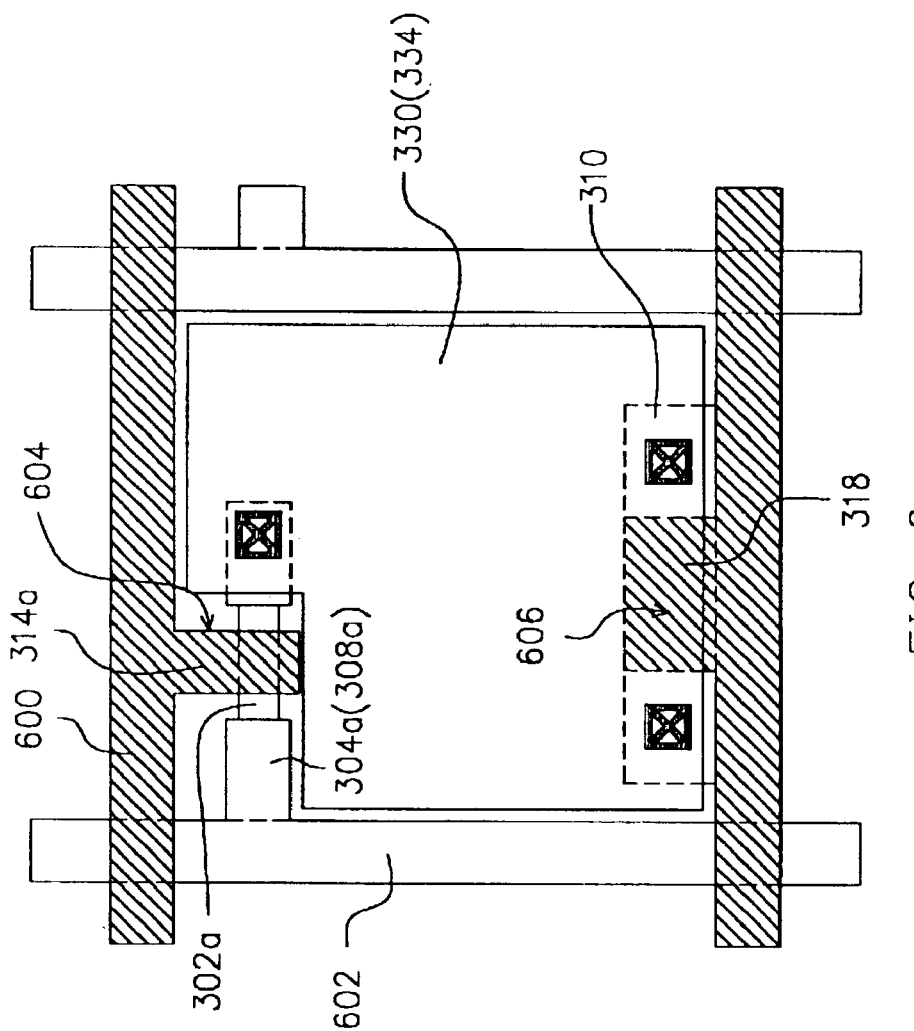
FIG. 6 is a top view showing the layout of a pixel according to one preferred embodiment of this invention.

FIG. 6 is a top view showing the layout of a pixel according to one preferred embodiment of this invention. As shown in FIG. 6, the pixel structure fabricated using the six masking steps mentioned in FIGS. 3A to 3I includes a scan line 600, a signal line 602, a thin film transistor 604, a storage capacitor 606 and a pixel electrode 330 (334). The thin film transistor 604 comprises a polysilicon layer 302a, a gate 314a, an N+ doped thin film 304a and a source/drain terminal 308a. In addition, the scan line 600 and the gate 314a of the thin film transistor 604 are electrically connected for controlling the switching of the lower channel layer (the polysilicon layer 302a). Data is transmitted through the signal line 602 and written into the pixel electrode 330 (334) under the control of the thin film transistor 604.

In summary, the method of fabricating a thin film transistor array and driving circuit according to this invention has at least the following advantages:
1. Only six masking steps are required to complete the fabrication of the thin film transistor array and the driving circuit. Hence, production cost is reduced.
2. With a reduction in the number of masking steps, time required to produce a display panel is shortened.
3. Similarly, reliability and hence yield of the display panel improves with a reduction of masking steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method for fabricating a thin film transistor array and a driving circuit, comprising the steps of:
   providing a substrate;
   sequentially forming a polysilicon layer and a thin film over the substrate,
   wherein the thin film is a first type heavily doped layer;
   patterning the polysilicon layer and the thin film to form a plurality of island structures;
   forming a second type heavily doped region in a portion of the thin film in the island structure;
   forming a gate and a source/drain terminal on each island structure and
   forming a storage capacitor on the substrate, wherein the gate, the source/drain terminal and the island structure together form a thin film transistor array and a driving circuit;
   forming a protection layer over the substrate;
   patterning the protection layer to form a plurality of openings in the protection layer;
   forming a conductive layer over the substrate; and
   patterning the conductive layer to form a plurality of wiring lines and a plurality of pixel electrodes, wherein the wiring lines serves as a connection between the thin film transistor in the array and the driving circuits.

2. The method of claim 1, wherein the step of forming the polysilicon layer includes the sub-steps of:
   forming an amorphous silicon layer over the substrate; and
   conducting an excimer laser annealing process to transform the amorphous silicon into polysilicon.

3. The method of claim 1, wherein the thin film is a N+ doped thin film.

4. The method of claim 3, wherein the step of forming the N+ doped thin film includes:
   conducting a direct chemical vapor deposition;
   forming an amorphous silicon layer; and
   doping the amorphous silicon layer with N-type ions.

5. The method of claim 1, wherein the second type heavily doped region includes a P+ doped region.

6. The method of claim 1, wherein the step for forming the gate, the source/drain terminal and the storage capacitor includes the sub-steps of:
   forming a first conductive layer;
   patterning the first conductive layer to form a source/drain terminal on each island structure and a plurality of lower electrodes on the substrate;

forming a second metallic layer; and patterning the second metallic layer to form a gate on each island structure and a plurality of upper electrodes on the substrate, wherein each pair of corresponding lower electrode and upper electrode form a storage capacitor.

7. The method of claim 1, wherein the step for forming the gate, the source/drain terminal and the storage capacitor includes the sub-steps of:

forming a first conductive layer;

patterning the first conductive layer to form a gate on each island structure and a plurality of lower electrodes on the substrate;

forming a second metallic layer; and patterning the second metallic layer to form a source/drain terminal on each island structure and a plurality of upper electrodes on the substrate, wherein each pair of lower electrode and corresponding upper electrode form a storage capacitor.

8. The method of claim 1, wherein before the step of forming the gate further includes forming a gate insulation layer.

9. The method of claim 8, wherein after the step of forming the gate insulation layer further includes:

conducting a rapid thermal process to anneal the gate insulation layer; and forming at least a first dielectric layer such that material constituting the first dielectric layer is selected from a group consisting of silicon oxide, silicon nitride and hydrogen-containing material.

10. The method of claim 8, wherein the step of forming the gate insulation layer includes the sub-steps of:

forming at least a first dielectric layer, wherein material constituting the first dielectric layer is selected from a group consisting of silicon oxide, silicon nitride and hydrogen-containing material; and forming a second dielectric layer, wherein material constituting the second dielectric layer includes a photosensitive resin.

11. The method of claim 1, wherein after the step of forming the source/drain terminal further includes removing the exposed thin film outside the source/drain terminal covered area; and after removing the thin film further including forming a first lightly doped region between the gate and the source/drain terminal.

12. The method of claim 1, wherein a material constituting the gate is selected from the group consisting of aluminum/molybdenum alloy and aluminum/titanium alloy;

a material constituting the source/drain terminal is selected from a group consisting of aluminum/molybdenum alloy and molybdenum; and a material constituting the conductive layer includes indium-tin oxide.

13. A method for fabricating a reflective thin film transistor array and driving circuit, comprising the steps of:

providing a substrate;

sequentially forming a polysilicon layer and a thin film over the substrate, wherein the thin film is a first type heavily doped layer;

patterning the polysilicon layer and the thin film to form a plurality of island structures;

forming a second type heavily doped region in a portion of the thin film in the island structures;

forming a gate and a source/drain terminal on each island structure and forming a storage capacitor on the substrate, wherein the gate, the source/drain terminal and the island structure together form a thin film transistor array and a driving circuit;

forming a protection layer over the substrate, wherein the passivation layer has a plurality of roughened surfaces in the location that corresponds to a thin film transistor array;

patterning the protection layer to form a plurality of openings in the protection layer;

forming a conductive layer over the substrate; and patterning the conductive layer to form a plurality of wiring lines and a plurality of pixel electrodes, wherein the wiring lines serves as a connection between the thin film transistor in the array and the driving circuits and the pixel electrodes are positioned on the roughened surfaces.

14. The method of claim 13, wherein the step of forming the polysilicon layer includes the sub-steps of:

forming an amorphous silicon layer over the substrate; and conducting an excimer laser annealing process to transform the amorphous silicon into polysilicon.

15. The method of claim 13 wherein the thin film is a N+ doped thin film.

16. The method of claim 15, wherein the step of forming the N+ doped thin film includes conducting a direct chemical vapor deposition;

forming an amorphous silicon layer; and doping the amorphous silicon layer with N-type ions.

17. The method of claim 13, wherein the second type heavily doped region includes a P+ doped region.

18. The method of claim 13, wherein the step for forming the gate, the source/drain terminal and the storage capacitor includes the sub-steps of:

forming a first conductive layer;

patterning the first conductive layer to form a source/drain terminal on each island structure and a plurality of lower electrodes on the substrate;

forming a second metallic layer; and patterning the second metallic layer to form a gate on each island structure and a plurality of upper electrodes on the substrate, wherein each pair of corresponding lower electrode and upper electrode form a storage capacitor.

19. The method of claim 13, wherein the step for forming the gate, the source/drain terminal and the storage capacitor includes the sub-steps of:

forming a first conductive layer;

patterning the first conductive layer to form a gate on each island structure and a plurality of lower electrodes on the substrate;

forming a second metallic layer; and patterning the second metallic layer to form a source/drain terminal on each island structure and a plurality of upper electrodes on the substrate, wherein each pair of lower electrode and corresponding upper electrode form a storage capacitor.

20. The method of claim 13, wherein before the step of forming the gate further includes forming a gate insulation layer.

21. The method of claim 20, wherein the step of forming the gate insulation layer includes the sub-steps of:

forming at least a first dielectric layer, wherein material constituting the first dielectric layer is selected from a group consisting of silicon oxide, silicon nitride and hydrogen-containing material; and forming a second dielectric layer, wherein material constituting the second dielectric layer includes a photosensitive resin.

* * * * *